United States Patent
Oishi

(10) Patent No.: US 8,097,898 B2
(45) Date of Patent: Jan. 17, 2012

(54) LIGHT-EMITTING DIODE

(75) Inventor: Nodoka Oishi, Fujikawaguchiko-machi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 153 days.

(21) Appl. No.: 12/333,027

(22) Filed: Dec. 11, 2008

(65) Prior Publication Data
US 2009/0146176 A1    Jun. 11, 2009

(30) Foreign Application Priority Data
Dec. 11, 2007  (JP) ................. P2007-319613

(51) Int. Cl.
*H01L 33/00* (2010.01)
(52) U.S. Cl. ........ 257/99; 257/79; 257/81; 257/98; 257/100; 257/700; 257/E21.499; 257/E21.502; 257/E23.007; 257/E23.008; 257/E23.009; 257/E23.061; 257/E23.067; 438/22; 438/24; 438/25; 438/26; 438/116; 438/126; 438/127
(58) Field of Classification Search ........ 257/79, 257/E33.056, E33.058, E33.059, 81, 98, 257/99, 100, 700, E21.499, E21.502, E23.007, 257/E23.008, E23.009, E23.061, E23.067; 438/22, 24, 25, 26, 116, 126, 127
See application file for complete search history.

(56) References Cited

U.S. PATENT DOCUMENTS

| 6,504,299 | B1 * | 1/2003 | Tanaka ................. 313/504 |
| 2007/0292993 | A1 * | 12/2007 | Tanoue ................ 438/123 |
| 2008/0149960 | A1 * | 6/2008 | Amo et al. ............. 257/98 |
| 2008/0191232 | A1 * | 8/2008 | Lee et al. ............. 257/98 |
| 2009/0039381 | A1 * | 2/2009 | Kim et al. ............. 257/99 |

FOREIGN PATENT DOCUMENTS

| JP | 2001-352102 | 12/2001 | |
| JP | 2005-353802 | 12/2005 | |
| WO | WO 2007015606 | * 8/2007 | ............. 257/98 |

* cited by examiner

*Primary Examiner* — Benjamin Sandvik
*Assistant Examiner* — Farid Khan
(74) *Attorney, Agent, or Firm* — Browdy and Neimark, PLLC

(57) ABSTRACT

The outer peripheral portion of a substrate is provided with a first peripheral edge and a second peripheral edge. The first peripheral edge is provided on the edge portion of a first upper surface of the substrate on which a light-emitting diode element is mounted. The second peripheral edge is formed either on an extension of an imaginary line connecting an edge of the light-emitting facet of the light-emitting diode element and the first peripheral edge or inwardly of the extension. The second peripheral edge is located at a position where the first peripheral edge blocks direct light from the light-emitting diode element. This configuration prevents the second upper surface of the substrate provided between the first peripheral edge and the second peripheral edge from becoming deteriorated due to the direct light.

12 Claims, 5 Drawing Sheets

LIGHT-EMITTING DIODE

CROSS-REFERENCE TO THE RELATED APPLICATION

The application is based on and claims the priority benefit of Japanese Patent Application No. 2007-319613, filed on Dec. 11, 2007, the entire description of which is incorporated herein by reference.

FIELD OF THE INVENTION

The present invention relates to a light-emitting diode having a light-emitting diode element that is mounted on a substrate and is encapsulated in a sealing resin.

DESCRIPTION OF THE RELATED ART

In general, light-emitting diodes mounted on an insulative substrate and encapsulated in a sealing resin are well known. The sealing resin was applied, originally intended to seal the light-emitting diode element and electrical connections such as wires, bumps, and electrodes.

However, in many of the conventional light-emitting diodes, electrodes were formed to extend from an upper surface to a lower surface of the substrate via an edge surface thereof. Since the electrodes cover a wide surface area of the substrate, a small surface area of the substrate is left for the sealing resin to be directly adhered to the substrate. The substrate contains resin that can be fixedly adhered to the sealing resin, however an area of the electrodes that are made of metal is not so securely adhered to the substrate due to different qualities of materials, and thus, the area of electrodes contact with the sealing resin tends to easily lose adhesion strength. For example, when the substrate and the sealing resin are each thermally expanded due to heat generated during the operation of the light-emitting diode or a mounting process of the light-emitting diode onto other circuit boards of electronic devices or lighting apparatus, difference between their thermal expansion coefficients would cause strain at the adhered portion between them.

In particular, the most intense strain concentrates on the outer peripheral adhered portion between the substrate and the sealing resin, and this causes the resin to become more easily unstuck from an edge of the outer peripheral adhered portion.

In this context, as shown in FIG. 9, it is known to provide through holes 4 and 6 which penetrate a substrate 2 (for example, see Japanese Patent Application Laid-Open No. 2001-352102 and Japanese Patent Application Laid-Open No. 2005-353802). The through holes 4 and 6 are each formed to penetrate the substrate 2 to electrically connect an upper surface and a lower surface of the substrate, and a light-emitting diode element 8 is to be die-bonded and wire-bonded thereto. In this instance, electrodes are disposed in respective small areas on the upper surface of the substrate, the directly adhered portion between the upper surface of the substrate 2 and a sealing resin 10 can be enlarged, and as a result, adhesion enhancement between the substrate 2 and the sealing resin 10 can be achieved.

In addition, since electrodes do not extend near the outer peripheral portion of the upper surface of the substrate 2, the outer peripheral portion can be closely adhered to the sealing resin 10 along the outer peripheral portion.

However, the light emitted from the light-emitting diode element 8 would cause deterioration of the upper surface of the substrate 2 over years of operation. Moreover, repetitive thermal expansions of the substrate 2 and the sealing resin 10 due to heat generated by the light-emitting diode element 8 would cause the adhered portion between the substrate 2 and the sealing resin 10 to become unstuck. In particular, the beam of light from the light-emitting diode element 8 would directly hit and thus cause accelerated deterioration on the outer peripheral portion and its vicinity of the surface of the substrate 2. This deterioration and the effects of strain due to the thermal expansions would result in the sealing resin 10 being unstuck from the substrate 2.

SUMMARY OF THE INVENTION

It is an object of the present invention to provide a light-emitting diode which can prevent, without any additional member such as a light shield, deterioration of the outer peripheral portion and its vicinity of the substrate caused by the light emitted from the light-emitting diode element.

In an embodiment of the present invention, a light-emitting diode includes a substrate that has a first upper surface with at least a pair of electrodes formed on the first upper surface, a second upper surface adjacent to the first upper surface, a first peripheral edge being positioned between the first upper surface and the second upper surface, and a second peripheral edge being positioned outside the first peripheral edge when viewed from above, the light-emitting diode further includes at least one light-emitting diode element mounted on the first upper surface of the substrate and electrically connected to the electrodes, and the light-emitting diode further includes a sealing resin provided on the first upper surface and the second upper surface of the substrate to encapsulate the light-emitting diode element, and the light-emitting diode element has a light-emitting facet, and the second peripheral edge is provided with respect to an extension of an imaginary line connecting an edge of the light-emitting facet and the first peripheral edge of the substrate.

In addition, the second upper surface may be either a horizontal plane or an inclined plane. Also, the sealing resin is adhered to at least two planes of the substrate at an outer peripheral portion of the upper surface of the substrate, and adhesive strength can be enhanced.

Furthermore, the first peripheral edge may be provided on the entire outer peripheral portion of the first upper surface on which the light-emitting diode element is mounted, and the second peripheral edge may be provided on the entire outer peripheral portion of the second peripheral edge of the substrate.

Furthermore, the electrodes include a through hole that vertically penetrates the substrate.

DETAILED DESCRIPTION OF THE PREFERRED EMBODIMENTS

Preferred embodiments of, the present invention will now be described in more detail below with reference to the accompanying drawings.

Figure 1:
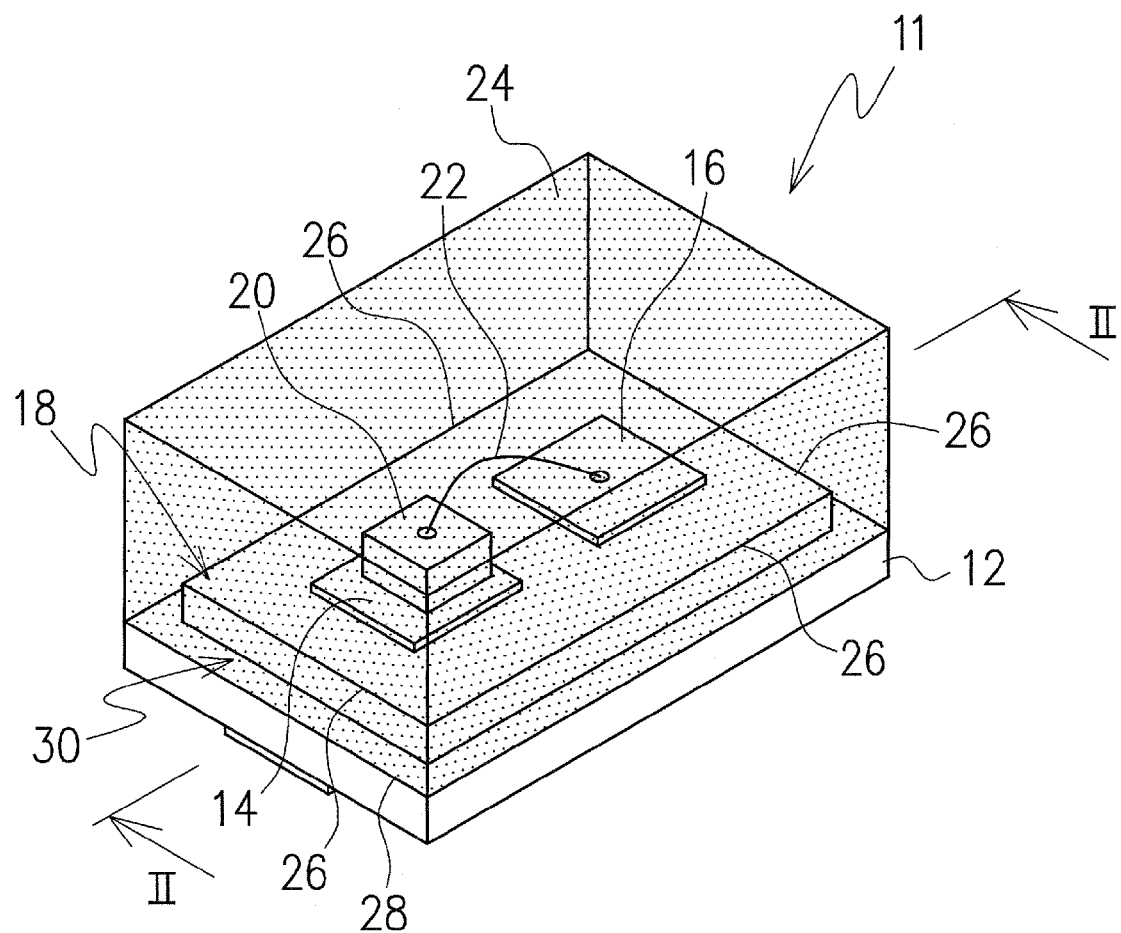
FIG. 1 is a perspective view illustrating a light-emitting diode according to an embodiment of the present invention.
Figure 2:
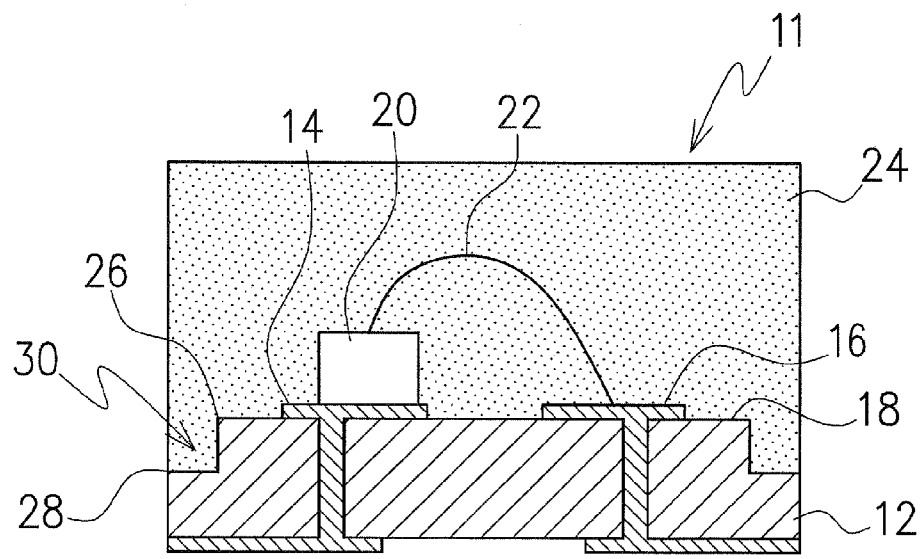
FIG. 2 is a cross-sectional view of the light-emitting diode taken along the line II-II of FIG. 1.
Figure 3:
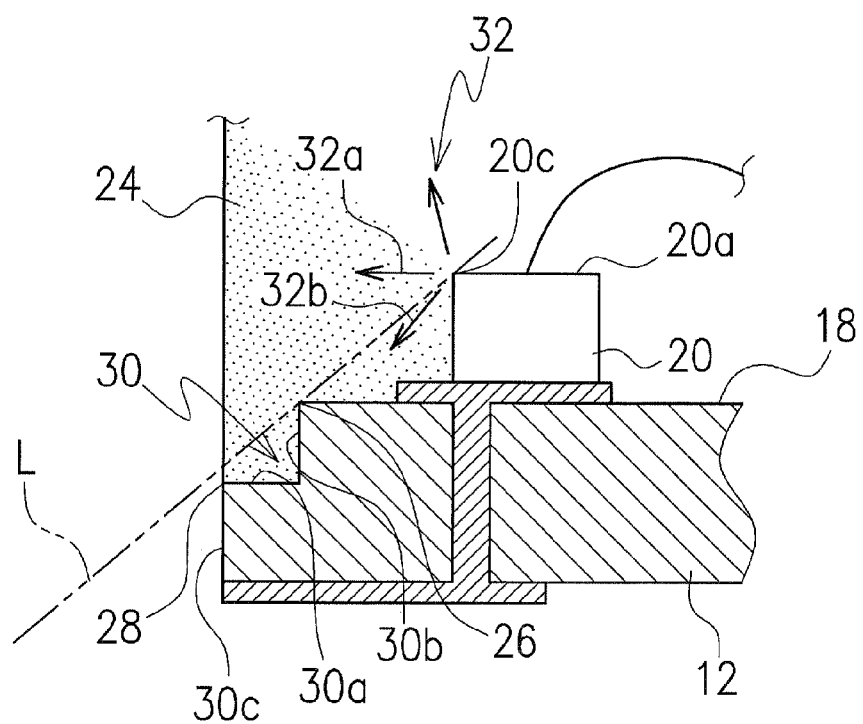
FIG. 3 is a cross-sectional view illustrating a second peripheral edge located inwardly of an extension of an imaginary line connecting an edge of a light-emitting facet and a first peripheral edge.

FIGS. 1 to 3 show a light-emitting diode according to an embodiment of the present invention. A light-emitting diode 11 of this embodiment includes a substrate 12 made of an insulating material such as glass epoxy or ceramic, and the substrate 12 having an upper surface that includes a first upper surface 18 on which upper electrodes 14 and 16 are provided and at least one light-emitting diode element is mounted and includes a second upper surface 30a that is mentioned later. The electrodes 14 and 16 of this embodiment include through holes that vertically penetrate the substrate 12, and the electrodes 14 and 16 are disposed on the first upper surface 18 of the substrate 12 to extend to close the through holes respectively, and the electrodes 14 and 16 have narrow areas just enough for the light-emitting diode element 20 to be die-bonded and wire-bonded thereto.

The light-emitting diode element 20 is die-bonded to one electrode 14 and wire-bonded with a wire 22 to the other electrode 16, and then encapsulated in a sealing resin 24 such as an epoxy resin or a silicone resin. The sealing resin is light-transmitting resin.

A first peripheral edge 26 is provided on at least one part of the outer peripheral portion of the first upper surface 18 of the substrate 12 according to this embodiment, and a second peripheral edge 28 is also provided outside the first peripheral edge 26 when viewed from above. In the present embodiment, the first peripheral edge 26 is provided on the entire outer peripheral portion of the first upper surface 18. Since the first peripheral edge 26 is positioned at an edge of a plane as the first upper surface on which the light-emitting diode element 20 is mounted, the first peripheral edge 26 is exposed or likely to be exposed to direct light from the light-emitting diode element 20.

The second peripheral edge 28 is located on an extension of an imaginary straight line L or inwardly of the extension L connecting the first peripheral edge 26 of the substrate and the junction edge. The edge of the light-emitting facet or the junction of the light-emitting element in this embodiment is substantially an edge of the upper surface of the light-emitting diode element, since the junction is located adjacent to the upper surface of the light-emitting diode element 20. The imaginary line L is defined in this manner for the following reasons. That is, since the outer peripheral portion of the upper surface of the substrate 12 would be seriously affected when exposed to the light emitted from the light-emitting diode element 20 in lower directions, the outer peripheral portion of the upper surface of the substrate 12 would easily degrade due to the effects of the light exposure. Furthermore, the outer peripheral portion of the upper surface of the substrate 12 would be exposed to light emission in lower directions, particularly emitted from the edge 20c of the upper surface 20a thereof.

In this context, the present embodiment assumes that the junction or the light-emitting facet is located generally at a same position as an upper surface 20a of the light-emitting diode element 20. Then, when the edge 20c of the upper surface 20a and the edge of the outer peripheral portion of the first upper surface 18 of the substrate (the first peripheral edge 26 in the present embodiment) are connected by an imaginary line L, the straight line L at an inclination angle which nearly equals the angle of travel of the light that may significantly affect the outer peripheral portion of the substrate 12. This embodiment is thus configured to block the light impinging upon the outer peripheral portion of the upper surface of the substrate 12 with respect to the imaginary line L.

Note that the upper surface 20a of the light-emitting diode element 20 is located at the same position as or near the position of the junction or a boundary semiconductor region; however, the present invention does not limit the position of the light-emitting facet to the upper surface. Thus, irrespective of the position at which the light-emitting diode element emits light, the straight line L is defined by connecting between the edge of the light-emitting facet and the first peripheral edge 26 to provide an extension of the imaginary line L as described above, thereby blocking in the most effective manner the light that may affect the outer peripheral portion of the substrate 12.

Furthermore, in order to block the light in the most effective manner as mentioned above, the imaginary line L is defined as connecting the edge 20c of the upper surface 20a of the light-emitting diode element 20 and the first peripheral edge 26. However, irrespective of the position at which the light-emitting diode element 20 emits light, any line connecting between the light emitting portion (the light-emitting facet) and the first peripheral edge 26 can be defined as the imaginary line L. This makes it possible to block or significantly reduce the light that hits the outer peripheral portion of the substrate 12. Accordingly, the imaginary line L does not necessarily pass through the edge 20c of the upper surface 20a of the light-emitting diode element 20.

Furthermore, there is also formed a shoulder portion 30 between the first peripheral edge 26 and the second peripheral edge 28 of the aforementioned substrate 12 of this embodiment. As shown in FIG. 3, the shoulder portion 30 is made up of a generally horizontal plane constituting a second upper surface 30a of the substrate 12 and a first vertical plane 30b which is generally upright and located between the edge of the first upper surface 18 and the second upper surface 30a. On these constituent planes, the outer peripheral portion of the aforementioned sealing resin 24 is closely engaged with the outer peripheral portion of the substrate 12. Furthermore, a second vertical plane 30c which is generally upright and oriented from the second peripheral edge 28 down toward to a lower surface of the substrate 12 constitutes sides or planes of the substrate 12, which are also contact with sides or planes of the generally cubic sealing resin 24.

As shown in FIG. 3, in the light-emitting diode of the present embodiment configured as above, direct light 32 emitted from the light-emitting diode element 20 is transmitted through the sealing resin 24 as well as to the upper surface of the substrate 12, particularly to the upper surface near the first peripheral edge 26. If the direct light 32 from the light-emitting diode element 20 is transmitted in the sealing resin 24 outwardly of the imaginary line L, as is the laterally-direct light 32a, then the direct light does not hit the first peripheral edge 26 and the second peripheral edge 28, and as a result, the outer peripheral portion of the upper surface of the substrate is not deteriorated.

Furthermore, lower-direct light 32b goes along the imaginary line L or inwardly of the line L would hit the first peripheral edge 26 or a portion inside it. At this time, the first peripheral edge 26 prevents the lower-direct light 32b from striking the second peripheral edge 28. Accordingly, lower-direct light 32 hardly hits the second peripheral edge 28 and the second upper surface 30a constituting the shoulder portion 30.

As described above, the second peripheral edge 28 and the second upper surface 30a of the substrate 12 are hidden by the first peripheral edge 26 and deterioration caused by the direct light 32 can be prevented. Thus, the sealing resin 24 is adhered to at least of two planes of the substrate at an outer peripheral portion of the upper surface of the substrate.

As such, the adhesive strength between the substrate 12 and the sealing resin 24 is enhanced. This ensures that the adherence between the substrate 12 and the sealing resin 24 is maintained for a long period of time.

Figure 4:
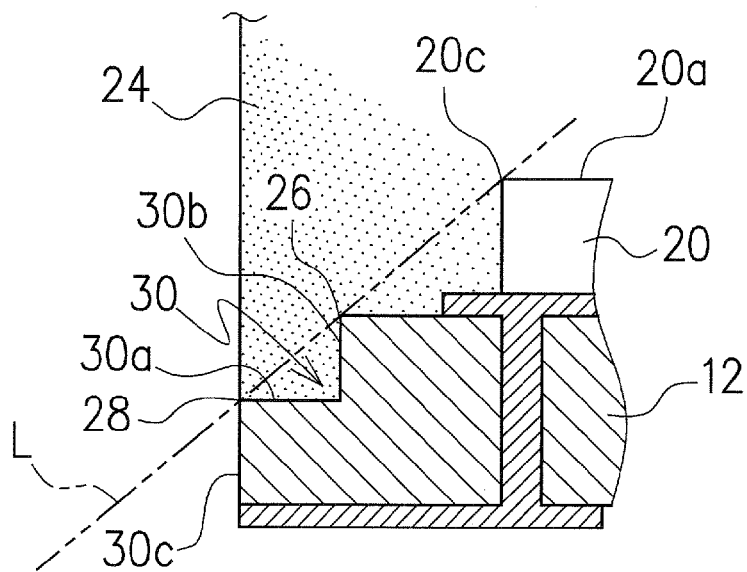
FIG. 4 is a cross-sectional view illustrating the second peripheral edge located on the extension.

Furthermore, as shown in FIG. 4, even when the second peripheral edge 28 of the substrate 12 is set so as to be located on the imaginary line L, the direct light 32 from the light-emitting diode element 20 does not hit the second upper surface 30a of the shoulder portion 30. Accordingly, in this configuration there is no deterioration in the adherability between the second upper surface 30a or the first vertical plane 30b, which constitutes the shoulder portion 30 that is closely contact with the sealing resin 24. It is thus possible to maintain stable adherence.

Furthermore, even when the second peripheral edge 28 is located slightly outwardly of the straight line L, the direct light 32 would hardly hit any part of the second upper surface 30a, thus causing no significant reduction in the adherability with the sealing resin. However, this configuration is not preferable because it can cause an increase in the external dimensions of the substrate 12 and thus the overall size of the device. In this case, deterioration in the vicinity of the second peripheral edge 28 on the outer circumference of the second upper surface 30a of the substrate 12 would cause degradation on the outer circumference portion that could most readily become unstuck. It is thus preferable to define the second peripheral edge 28 so as not to be struck by the direct light 32.

Furthermore, as described above, around the shoulder portion 30, three planes of the substrate engage with the sealing resin at the outer peripheral portion of the substrate 12. This shape makes it possible to structurally enhance the adhesive strength with the anchoring effect.

Furthermore, when compared with the case where only the horizontal plane of the substrate 12 and the planar surface of the sealing resin 24 are adhered to each other, the aforementioned formation of the shoulder portion 30 can increase an stable adhesion area between the substrate 12 and the sealing resin 24.

Figure 5:
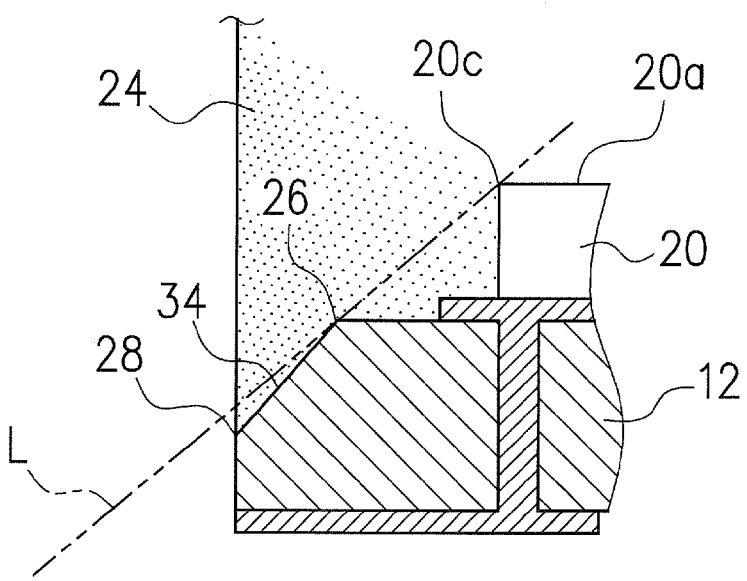
FIG. 5 is a cross-sectional view similar to FIG. 3 with the second upper surface being an inclined plane.

Note that as shown in FIG. 5, instead of the shoulder portion 30, an inclined plane 34 may also be formed as the second upper surface between the first peripheral edge 26 and the second peripheral edge 28. This can also increase the adhesive strength between the substrate 12 and the sealing resin 24. Furthermore, although not so effective as the shoulder portion 30, the inclined plane 34 also provides the anchoring effect of two contact planes of the substrate around the outer peripheral portion of the upper surface of the substrate.

Figure 6:
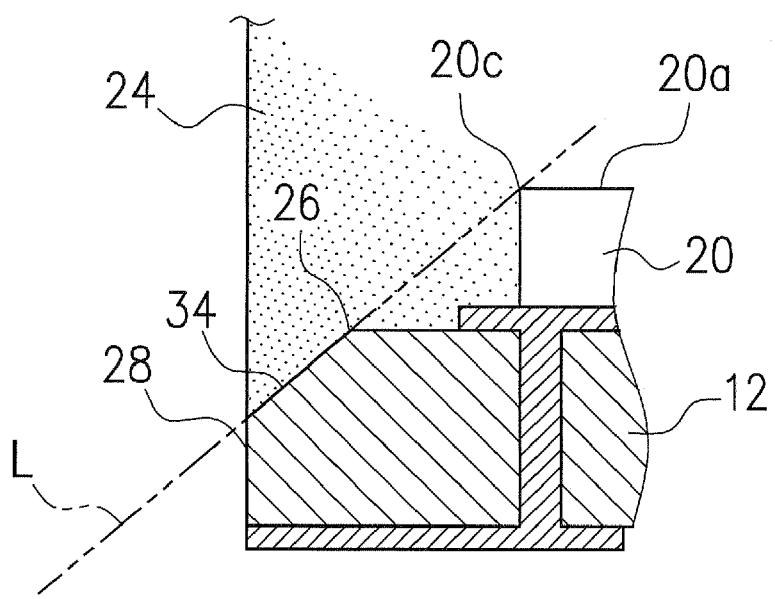
FIG. 6 is a cross-sectional view similar to FIG. 4 with the inclined plane located on the extension.

Furthermore, as shown in FIG. 6, the second peripheral edge 28 may also be located on the straight line L to prevent the direct light 32 impinging upon the inclined plane 34. It is thus possible to prevent the inclined plane 34 from becoming deteriorated, and maintain the adherability between the substrate 12 and the sealing resin 24.

Figure 7:
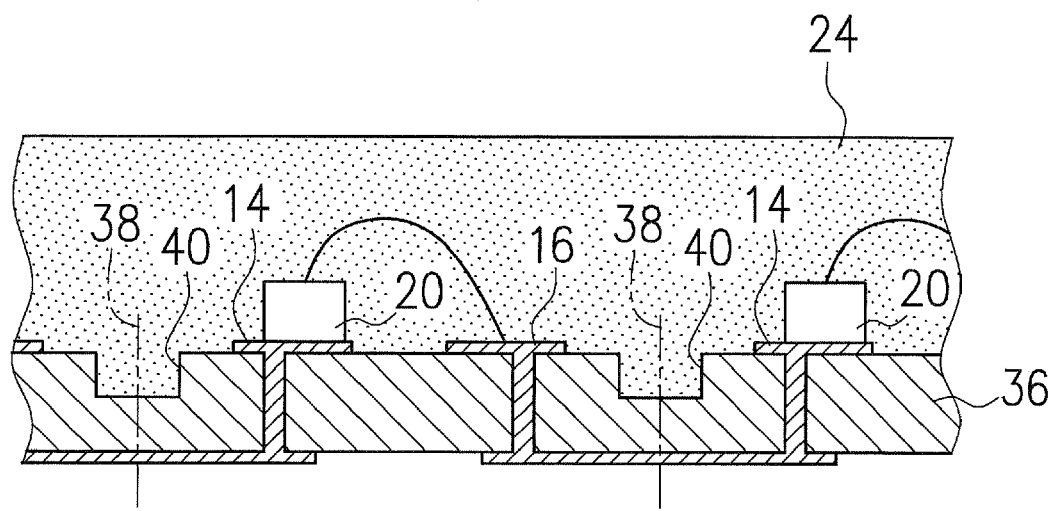
FIG. 7 is a cross-sectional view illustrating the steps for forming the first peripheral edge, the second peripheral edge, and the horizontal plane of the second upper surface.
Figure 8:
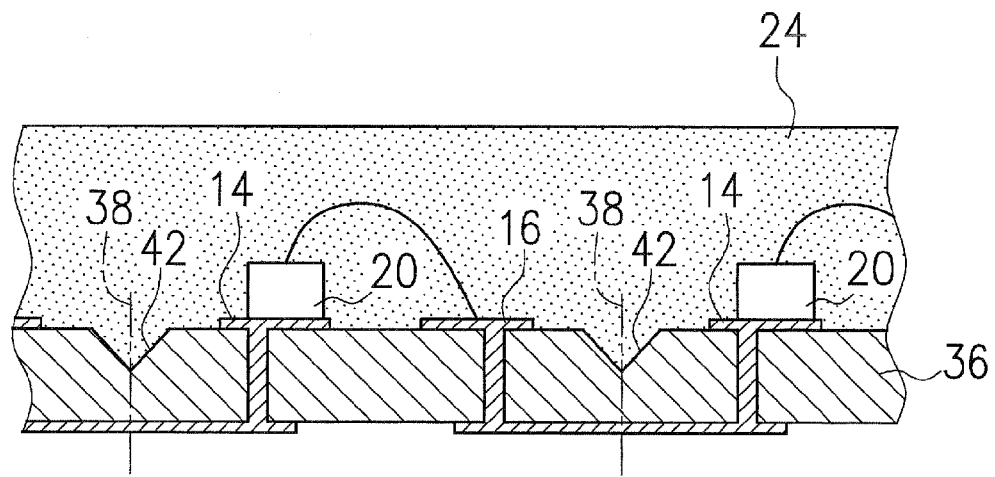
FIG. 8 is a cross-sectional view illustrating the steps for forming the first peripheral edge, the second peripheral edge, and the inclined plane of the second upper surface.
Figure 9:
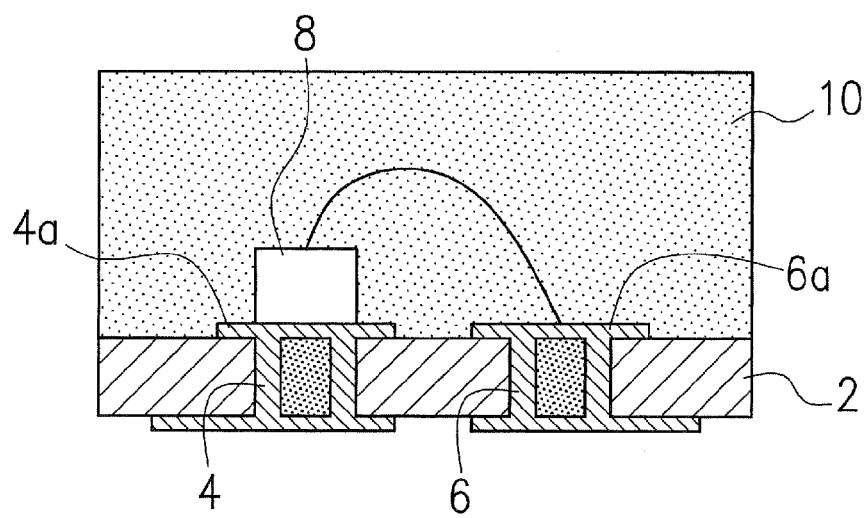
FIG. 9 is a cross-sectional view illustrating the structure of a conventional light-emitting diode.

The first peripheral edge 26, the second peripheral edge 28, the horizontal plane 30a serving as the second upper surface, and the inclined plane 34, all of which were described above, can be formed by a manufacturing method shown in FIG. 7 and FIG. 8. The light-emitting diode of this present embodiment is formed as follows. That is, a large substrate 36 including a plurality of substrates 12, on each of which the electrodes 14 and 16 are formed and the light-emitting diode element 20 is mounted and wire-bonded thereto, is encapsulated in the sealing resin 24. The substrate 36 is then diced into the individual light-emitting diodes.

In a manufacturing method, before the light-emitting diode element 20 is encapsulated in the sealing resin 24, the large substrate 36 is half-diced at a cut position 38, to form a groove 40 rectangular in cross section as shown in FIG. 7 or a groove 42 V-shaped in cross section as shown in FIG. 8. Thereafter, the light-emitting diode element 20 is encapsulated in the sealing resin 24 and the sealing resin 24 is filled into the grooves 40 and 42. Then, after the sealing resin 24 is hardened, the substrate 36 is diced at the cut position 38 or the center of the grooves 40 and 42 to separate the light-emitting diodes into individual ones. As a result, on the outer peripheral portion of the substrate 12 thus separated, it is possible to form the first peripheral edge 26, the second peripheral edge 28, and the horizontal plane 30a or the inclined plane 34, which serves as the second upper surface.

As described above, according to an embodiment of the present invention, the first peripheral edge is located at the edge of the first upper surface or the element-mounted side of the substrate having the electrodes formed thereon. The second peripheral edge is located along the outer peripheral portion of the substrate on an extension of the straight line connecting the first peripheral edge and the edge of the light-emitting facet of the light-emitting diode element or located inwardly of the extension. Even when the direct light from the light-emitting diode element hits the first peripheral edge, the first peripheral edge prevents the direct light from impinging upon the second peripheral edge. As a result, deterioration of the substrate at outer peripheral portion can be prevented. Thus, the outer peripheral portion of the substrate does not become deteriorated due to the light exposure, making it possible to maintain the adherence between the substrate and the sealing resin on the outer peripheral portion with improved reliability for a long period of time.

Furthermore, according to the present invention, the shoulder portion or the inclined plane is formed between the first peripheral edge and the second peripheral edge. This configuration strengthens the adhesion between the substrate and the sealing resin. Furthermore, the formation of the shoulder portion or the inclined plane between the first peripheral edge and the second peripheral edge allows the substrate and the sealing resin to structurally engage with each other in the vicinity of the shoulder portion or the inclined plane. The adhesion strength can thus also be structurally enhanced due to the anchoring effect.

Furthermore, according to the present invention, the first peripheral edge and the second peripheral edge are provided on the entire outer circumference of the substrate, the adhesion strength of the outer peripheral portion is enhanced. Thus, even when expansive strain caused by heat generated upon light emission concentrates on the outer circumference portion of the substrate and the sealing resin, it is still possible to prevent the portion from becoming unstuck.

Furthermore, according to the present invention, through holes penetrating the substrate electrically connect the upper surface and the lower surface of the substrate, without the electrodes extending from the upper surface to the lower surface via side surfaces. This configuration, together with the effects of the aforementioned structure of the outer peripheral portion of the substrate, makes it possible to maintain the strong adhesion between the outer peripheral portion of the substrate and the sealing resin in a good condition for a long period of time.

The structure of the substrate for the light-emitting diode according to the present invention can be used for the substrate of various devices on which a light-emitting diode element or light-emitting element is mounted.

While the present invention has been described above in accordance with the embodiments, it should be noted that the present invention is not limited to these embodiments, and various modifications and changes may be made thereto without deviating from the scope and spirit of the invention.

What is claimed is:

1. A light-emitting diode, comprising:
a substrate made of an insulating material and having an upper surface, the upper surface including:
a first upper surface having at least a pair of electrodes formed on the first upper surface,
a second upper surface provided adjacent to the first upper surface at a position lower than a height of the first upper surface,
a first peripheral edge being positioned between the first upper surface and the second upper surface, and
a second peripheral edge of the second upper surface being positioned outside the first peripheral edge when viewed from above;
at least one light-emitting diode element mounted on the first upper surface of the substrate and electrically connected to the electrodes formed on the first upper surface of the substrate;
a light-transmitting sealing resin provided on and in direct contact with the first upper surface and the second upper surface of the substrate to the second peripheral edge of the second upper surface to encapsulate all of the light-emitting diode element, the first upper surface, the first peripheral edge, and the second upper surface; and
the light-emitting diode element having a light-emitting facet, and the second peripheral edge being positioned inwardly of an extension of an imaginary line connecting an edge of the light-emitting facet and the first peripheral edge of the substrate.

2. A light-emitting diode, comprising:
a substrate made of an insulating material, the substrate having an upper surface, the upper surface including:
a first upper surface having at least a pair of electrodes formed on the first upper surface,
a second upper surface provided adjacent to the first upper surface at a position lower than a height of the first upper surface,
a first peripheral edge being positioned between the first upper surface and the second upper surface, and a second peripheral edge of the second upper surface being positioned outside the first peripheral edge when viewed from above;
at least one light-emitting diode element mounted on the first upper surface of the substrate and electrically connected to the electrodes formed on the first upper surface of the substrate;
a light-transmitting sealing resin provided on and in direct contact with the first upper surface and the second upper surface of the substrate to the second peripheral edge of the second upper surface to encapsulate all of the light-emitting diode element, the first upper surface, the first peripheral edge, and the second upper surface; and
the light-emitting diode element having a light-emitting facet, and the second peripheral edge being positioned on an extension of an imaginary line connecting an edge of the light-emitting facet and the first peripheral edge of the substrate.

3. The light-emitting diode according to claim 1, the second upper surface of the substrate comprising a generally horizontal plane that constitutes a part of a shoulder portion formed between the first peripheral edge and the second peripheral edge of the substrate.

4. The light-emitting diode according to claim 2, the second upper surface of the substrate comprising a generally horizontal plane that constitutes a part of a shoulder portion formed between the first peripheral edge and the second peripheral edge of the substrate.

5. The light-emitting diode according to claim 1, the second upper surface of the substrate comprising an inclined plane positioned between the first peripheral edge and the second peripheral edge of the substrate, and the sealing resin is in contact with the inclined plane.

6. The light-emitting diode according to claim 2, the second upper surface of the substrate comprising an inclined plane positioned between the first peripheral edge and the second peripheral edge of the substrate, and the sealing resin is in contact with the inclined plane.

7. The light-emitting diode according to claim 1, the first peripheral edge of the substrate provided entirely on an outer peripheral portion of the first upper surface of the substrate, and the second peripheral edge of the substrate provided entirely on an outer peripheral portion of the second upper surface of the substrate.

8. The light-emitting diode according to claim 2, the first peripheral edge of the substrate provided entirely on an outer peripheral portion of the first upper surface of the substrate, and the second peripheral edge of the substrate provided entirely on an outer peripheral portion of the second upper surface of the substrate.

9. The light-emitting diode according to claim 1, the electrodes including through holes that vertically penetrate the substrate and are electrically connected to lower electrodes that are provided on a lower surface of the substrate.

10. The light-emitting diode according to claim 2, the electrodes including through holes that vertically penetrate the substrate and are electrically connected to lower electrodes that are provided on a lower surface of the substrate.

11. The light-emitting diode according to claim 3, wherein the shoulder portion of the substrate includes the substantially horizontal plane and a substantially vertical plane, and the light-transmitting sealing resin is in contact with the planes of the shoulder portion of the substrate.

12. The light-emitting diode according to claim 4, wherein the shoulder portion of the substrate includes the substantially horizontal plane and a substantially vertical plane, and the light-transmitting sealing resin is in contact with the planes of the shoulder portion of the substrate.

* * * * *